(12) United States Patent
Shimbo

(10) Patent No.: US 12,080,805 B2
(45) Date of Patent: *Sep. 3, 2024

(54) SEMICONDUCTOR CHIP

(71) Applicant: SOCIONEXT INC., Kanagawa (JP)

(72) Inventor: Hiroyuki Shimbo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,689

(22) Filed: Jul. 25, 2023

(65) Prior Publication Data

US 2024/0021735 A1 Jan. 18, 2024

Related U.S. Application Data

(63) Continuation of application No. 17/724,143, filed on Apr. 19, 2022, now Pat. No. 11,749,757, which is a
(Continued)

(30) Foreign Application Priority Data

Aug. 1, 2016 (JP) .................................. 2016-150960

(51) Int. Cl.
*H01L 27/00* (2006.01)
*H01L 21/8238* (2006.01)
(Continued)

(52) U.S. Cl.
CPC .... *H01L 29/78696* (2013.01); *H01L 21/8238* (2013.01); *H01L 27/088* (2013.01);
(Continued)

(58) Field of Classification Search
CPC ............... H01L 27/0207; H01L 27/092; H10L 29/0673; H10L 29/41733; H10L 29/42392; H10L 29/78696
See application file for complete search history.

(56) References Cited

U.S. PATENT DOCUMENTS 10,868,192 B2 12/2020 Shimbo
11,335,814 B2 5/2022 Shimbo
(Continued)

FOREIGN PATENT DOCUMENTS

CN 104009032 A 8/2014
CN 104282655 A 1/2015
(Continued)

OTHER PUBLICATIONS

S. Bangsaruntip, et al. "High performance and highly uniform gate-all-around silicon nanowire MOSFETs with wire size dependent scaling", Electron Devices Meeting (IEDM), 2009 IEEE International, Jan. 2010, pp. 297-300.
(Continued)

*Primary Examiner* — Reema Patel
(74) *Attorney, Agent, or Firm* — Rimon P.C.

(57) ABSTRACT

Provided is a semiconductor chip including a nanowire field effect transistor (FET) and having a layout configuration effective for making manufacturing the chip easy. A semiconductor chip includes a first block including a standard cell having a nanowire PET and a second block including a nanowire FET. In the first and second blocks, nanowires extending in an X direction have an arrangement pitch in a Y direction of an integer multiple of a pitch P1. Pads have an arrangement pitch in the X direction of an integer multiple of a pitch P2.

12 Claims, 8 Drawing Sheets

Related U.S. Application Data continuation of application No. 17/095,593, filed on Nov. 11, 2020, now Pat. No. 11,335,814, which is a continuation of application No. 16/262,309, filed on Jan. 30, 2019, now Pat. No. 10,868,192, which is a continuation of application No. PCT/JP2017/025300, filed on Jul. 11, 2017.

(51) Int. Cl.
| | |
|---|---|
| *H01L 27/088* | (2006.01) |
| *H01L 27/092* | (2006.01) |
| *H01L 27/118* | (2006.01) |
| *H01L 29/06* | (2006.01) |
| *H01L 29/417* | (2006.01) |
| *H01L 29/423* | (2006.01) |
| *H01L 29/775* | (2006.01) |
| *H01L 29/786* | (2006.01) |
| H01L 21/8234 | (2006.01) |
| H01L 27/02 | (2006.01) |
| H01L 27/12 | (2006.01) |

(52) U.S. Cl.
CPC ...... *H01L 27/092* (2013.01); *H01L 27/11807* (2013.01); *H01L 29/06* (2013.01); *H01L 29/0673* (2013.01); *H01L 29/41733* (2013.01); *H01L 29/42392* (2013.01); *H01L 29/775* (2013.01); *H01L 21/823412* (2013.01); *H01L 21/823475* (2013.01); *H01L 27/0207* (2013.01); *H01L 2027/11874* (2013.01); *H01L 27/1203* (2013.01)

(56) References Cited

U.S. PATENT DOCUMENTS

| | | | | |
|---|---|---|---|---|
| 11,749,757 B2 * | 9/2023 | Shimbo | ............... | H01L 27/088 257/105 |
| 2004/0211983 A1 * | 10/2004 | Tien | ............... | H01L 27/0207 257/206 |
| 2006/0243955 A1 | 11/2006 | Fujimoto | | |
| 2011/0057163 A1 | 3/2011 | Liu et al. | | |
| 2014/0245248 A1 | 8/2014 | Yang et al. | | |
| 2015/0014775 A1 | 1/2015 | Seo et al. | | |
| 2016/0049395 A1 | 2/2016 | Okagaki et al. | | |
| 2016/0079358 A1 | 3/2016 | Doornbos et al. | | |
| 2017/0040322 A1 | 2/2017 | Kwon et al. | | |

FOREIGN PATENT DOCUMENTS

| | | |
|---|---|---|
| CN | 105374828 A | 3/2016 |
| JP | 2010-021393 A | 1/2010 |
| JP | 2015-019067 A | 1/2015 |
| JP | 2016-042568 A | 3/2016 |
| WO | 2009/150999 A1 | 12/2009 |

OTHER PUBLICATIONS

I. Lauer, et al. "Si Nanowire CMOS Fabricated with Minimal Deviation from RMG Fin FET Technolody Showing Record Performance", 2015 Symposium on VLSI Technology Digest of Technical Papers (Abstract).
International Search Report issued in Application No. PCT/JP2017/025300 dated Oct. 3, 2017, with English translation.
Written Opinion issued in Application No. PCT/JP2017/025300 dated Oct. 3, 2017, with partial English translation.
Non-Final Office Action issued Mar. 27, 2020 in U.S. Appl. No. 16/262,309.
Notice of Allowance issued Aug. 11, 2020 in U.S. Appl. No. 16/262,309.
Non-Final Office Action issued Oct. 1, 2021 in U.S. Appl. No. 17/095,593.
Notice of Allowance issued Jan. 26, 2022 in U.S. Appl. No. 17/095,593.
Chinese Office Action issued in Chinese Application No. 201780047180.0 on Sep. 5, 2022, with partial English translation.
Non-Final Office Action issued Feb. 14, 2023 in U.S. Appl. No. 17/724,143.
Notice of Allowance issued May 8, 2023 in U.S. Appl. No. 17/724,143.

* cited by examiner

SEMICONDUCTOR CHIP

CROSS-REFERENCE TO RELATED APPLICATIONS

This application is a Continuation of U.S. patent application Ser. No. 17/724,143, filed on Apr. 19, 2022, now U.S. Pat. No. 11,749,757, which is a Continuation of U.S. patent application Ser. No. 17/095,593, filed on Nov. 11, 2020, now U.S. Pat. No. 11,335,814, which is a Continuation of U.S. patent application Ser. No. 16/262,309, filed on Jan. 30, 2019, now U.S. Pat. No. 10,868,192, which is a Continuation of International Patent Application No. PCT/JP2017/025300, filed on Jul. 11, 2017, which claims priority to Japanese Patent Application No. 2016-150960, filed on Aug. 1, 2016, the entire disclosures of which Applications are incorporated by reference herein.

BACKGROUND

The present disclosure relates to a semiconductor chip including a standard cell including a nanowire field effect transistor (FET).

A standard cell design has been known as a method of forming a semiconductor integrated circuit on a semiconductor substrate. The standard cell design refers to a method of designing a large-scale integrated circuit (LSI) chip by providing in advance, as standard cells, unit logic elements having particular logical functions (for example, an inverter, a latch, a flip-flop, and a full adder), laying out those standard cells on a semiconductor substrate, and connecting those standard cells together through an interconnect.

Reducing a gate length (scaling) of transistors that are a basic element of the LSI have achieved more integrated transistors, reduced an operating voltage, and improved an operating rate. However, recently, off-current has been increased due to excessive scaling, and power has been consumed more and more due to the increase in off-current, which are problems. In order to solve such problems, three-dimensional transistors having a three-dimensional structure that is changed from a conventional two-dimensional structure have been actively researched. As one technique, nanowire FETs draw attention.

Examples of a method for manufacturing nanowire FETs are disclosed in S. Bangsaruntip, et al. "High performance and highly uniform gate-all-around silicon nanowire MOSFETs with wire size dependent scaling", Electron Devices Meeting (IEDM), 2009 IEEE International and Isaac Laucer, et al. "Si Nanowire CMOS Fabricated with Minimal Deviation from RMG Fin FET Technology Showing Record Performance", 2015 Symposium on VLSI Technology Digest of Technical Papers.

SUMMARY

So far, neither a structure of a standard cell with a nanowire FET nor a layout of a semiconductor integrated circuit device including such a nanowire FET has been specifically studied.

The present disclosure provides a semiconductor chip including a nanowire field effect transistor (FET) and having a layout configuration effective for making manufacturing the chip easy.

A first aspect of the present disclosure is directed to a semiconductor chip including a first block including a standard cell having a nanowire field effect transistor (FET) and a second block including a nanowire PET. The nanowire FETs included in the first and second blocks each include a nanowire extending in a first direction, the nanowire being a single nanowire or including a plurality of parallelly arranged nanowires; a pair of pads that are arranged at both ends of the nanowire in the first direction, each have a lower surface below a lower surface of the nanowire, and are each connected to the nanowire; and a gate electrode that extends in a second direction perpendicular to the first direction, and surrounds a periphery of the nanowire within a predetermined range of the nanowire in the first direction. In the first and second blocks, the nanowires have an arrangement pitch in the second direction of an integer multiple of a predetermined first pitch, and the pads have an arrangement pitch in the first direction of an integer multiple of a predetermined second pitch.

According to this aspect, the semiconductor chip includes the first block including the standard cell having the nanowire FET and the second block including the nanowire FET. In the first and second blocks, the nanowires extending in the first direction have an arrangement pitch in the second direction, i.e., a direction in which the gate electrode extends, of an integer multiple of the predetermined first pitch, and the pads have an arrangement pitch in the first direction of an integer multiple of the predetermined second pitch. This configuration improves the regularity of arrangement of the nanowires and the pads of the semiconductor chip. Consequently, the semiconductor chip is easily manufactured, and a reduction in process-induced variations and improvement in yield can be achieved.

A second aspect of the present disclosure is directed to a semiconductor chip including a first block including a standard cell having a nanowire field effect transistor (FET) and a second block including a nanowire FET. The nanowire FETs included in the first and second blocks each include: a nanowire extending in a first direction, the nanowire being a single nanowire or including a plurality of parallelly arranged nanowires; a pair of pads that are respectively arranged at both ends of the nanowire in the first direction, each have a lower surface below a lower surface of the nanowire, and are each connected to the nanowire; and a gate electrode that extends in a second direction perpendicular to the first direction, and surrounds a periphery of the nanowire within a predetermined range of the nanowire in the first direction. In at least one of the nanowire FETs included in the first and second blocks, the nanowires are arranged in a third direction perpendicular to the first direction and the second direction, and in the first and second blocks, the nanowires have an arrangement pitch in the second direction of an integer multiple of a predetermined first pitch and have an arrangement pitch in the third direction of an integer multiple of a predetermined nanowire stack pitch.

According to this aspect, the semiconductor chip includes the first block including the standard cell having the nanowire FET and the second block including the nanowire FET. In the first and second blocks, the nanowires extending in the first direction have an arrangement pitch in the second direction, i.e., a direction in which the gate electrode extend, of an integer multiple of the predetermined first pitch and an arrangement pitch in the third direction, perpendicular to the first and second directions, of an integer multiple of the predetermined nanowire stack pitch. This configuration improves the regularity of arrangement of the nanowires of the semiconductor chip. Consequently, the semiconductor chip is easily manufactured, and a reduction in process-induced variations and improvement in yield can be achieved.

The present disclosure improves the regularity of arrangement of nanowires and pads in a semiconductor integrated circuit device including a nanowire FET, and can thus reduce process-induced variations and improve yield.

DETAILED DESCRIPTION

Embodiments will be described with reference to the drawings. In the following description of the embodiment, it is assumed that a semiconductor chip includes a plurality of standard cells, at least some of which include a nanowire field effect transistor (FET).

Figure 7:
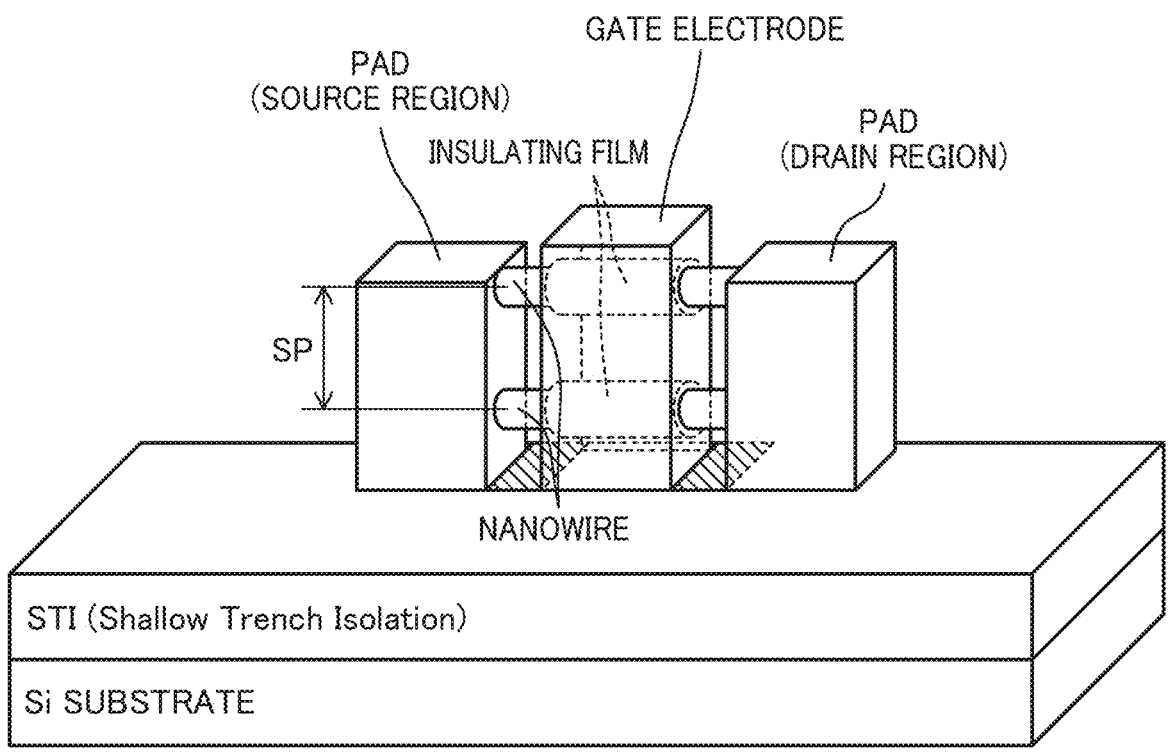
FIG. 7 schematically illustrates a basic configuration for the nanowire FET.

FIG. 7 is a schematic diagram of a basic structure example of the nanowire FET (also referred to as a nanowire gate all around (GAA) FET). The nanowire FET is a FET including thin wires (nanowires) through each of which a current flows. The nanowires are made of, e.g., silicon. As illustrated in FIG. 7, the nanowires are formed so as to extend horizontally above a substrate, i.e., extend parallel to the substrate, and each have both ends respectively connected to elements serving as source and drain regions of the nanowire PET. In this specification, in a nanowire PET, elements connected to both ends of a nanowire and serving as source and drain regions of the nanowire FET are each called a pad. In FIG. 7, a shallow trench isolation (STI) is formed on a Si substrate. However, the Si substrate is exposed in an (hatched) area under the nanowire. The hatched area may actually be covered with, e.g., a thermal oxide film. In FIG. 7, such a film is omitted for the sake of simplicity.

The nanowire is surrounded by a gate electrode comprised of, e.g., polysilicon via an insulating film such as a silicon oxide film. The pads and the gate electrode are formed on the substrate surface. With this configuration, all of upper, lower, and both side portions of a channel region of the nanowire are surrounded by the gate electrode, and thus, the electric field is evenly applied to the channel region, thus improving switching characteristics of the FET.

Although at least portions of the pads connected to the nanowire serve as the source/drain regions, portions of the pads below the portions connected to the nanowire does not necessarily serve as the source/drain regions. Portions of the nanowire (portions thereof not surrounded by the gate electrode) may serve as the source/drain regions.

Figure 8:
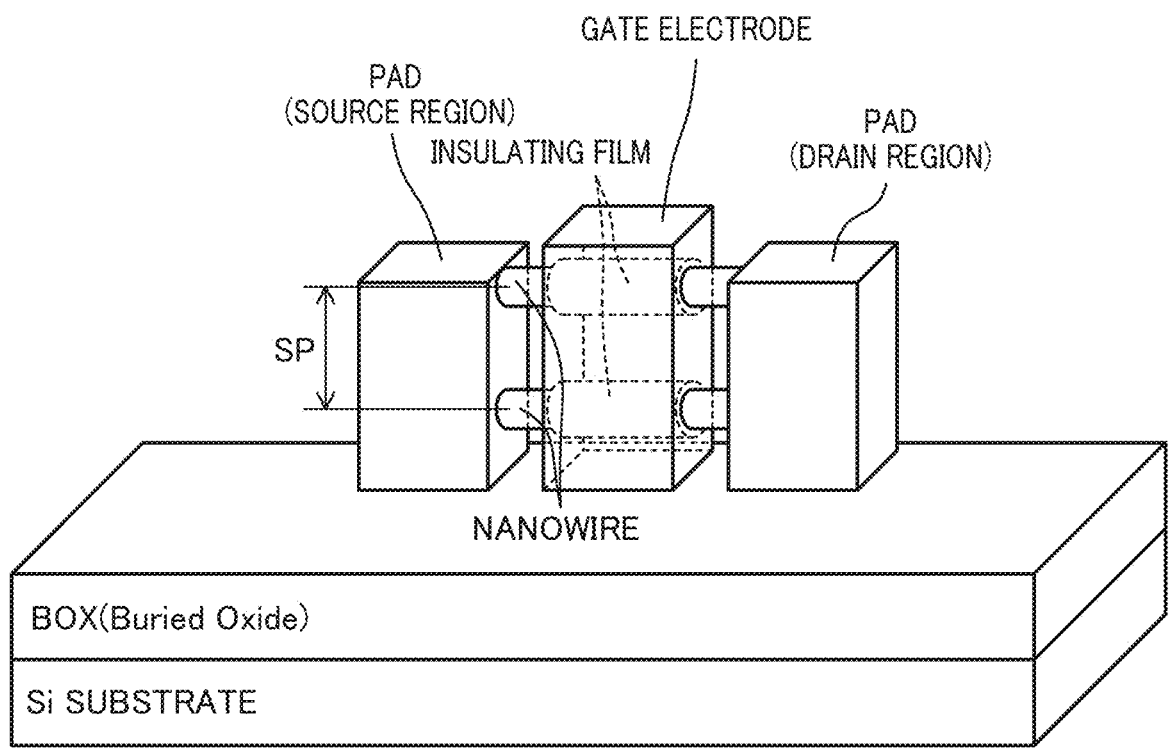
FIG. 8 schematically illustrates a basic configuration for the nanowire FET.

As shown in FIG. 8, in some cases, a buried oxide (BOX) is formed on the upper surface of the substrate, and the nanowire FET is formed on the BOX.

In the structures of FIGS. 7 and 8, two nanowires are arranged in parallel in a direction perpendicular to a substrate surface. That is to say, the nanowires are stacked in two tiers. The nanowires may be stacked in three or more ties in the direction perpendicular to the substrate surface, or only one nanowire may be arranged. Nanowire FETs having different numbers of tiers of nanowires may be incorporated into the same semiconductor chip. In FIGS. 7 and 8, SP is a center-to-center distance between the nanowires stacked in a plurality of tiers, i.e., a pitch of the nanowires in the direction perpendicular to the substrate surface (a nanowire stack pitch). In FIGS. 7 and 8, the upper end of the uppermost nanowire and the upper end of the pad are at the same height. However, the upper ends of these components do not necessarily have to be at the same height, and the upper end of the pad may be situated above the upper end of the uppermost nanowire.

Figure 1:
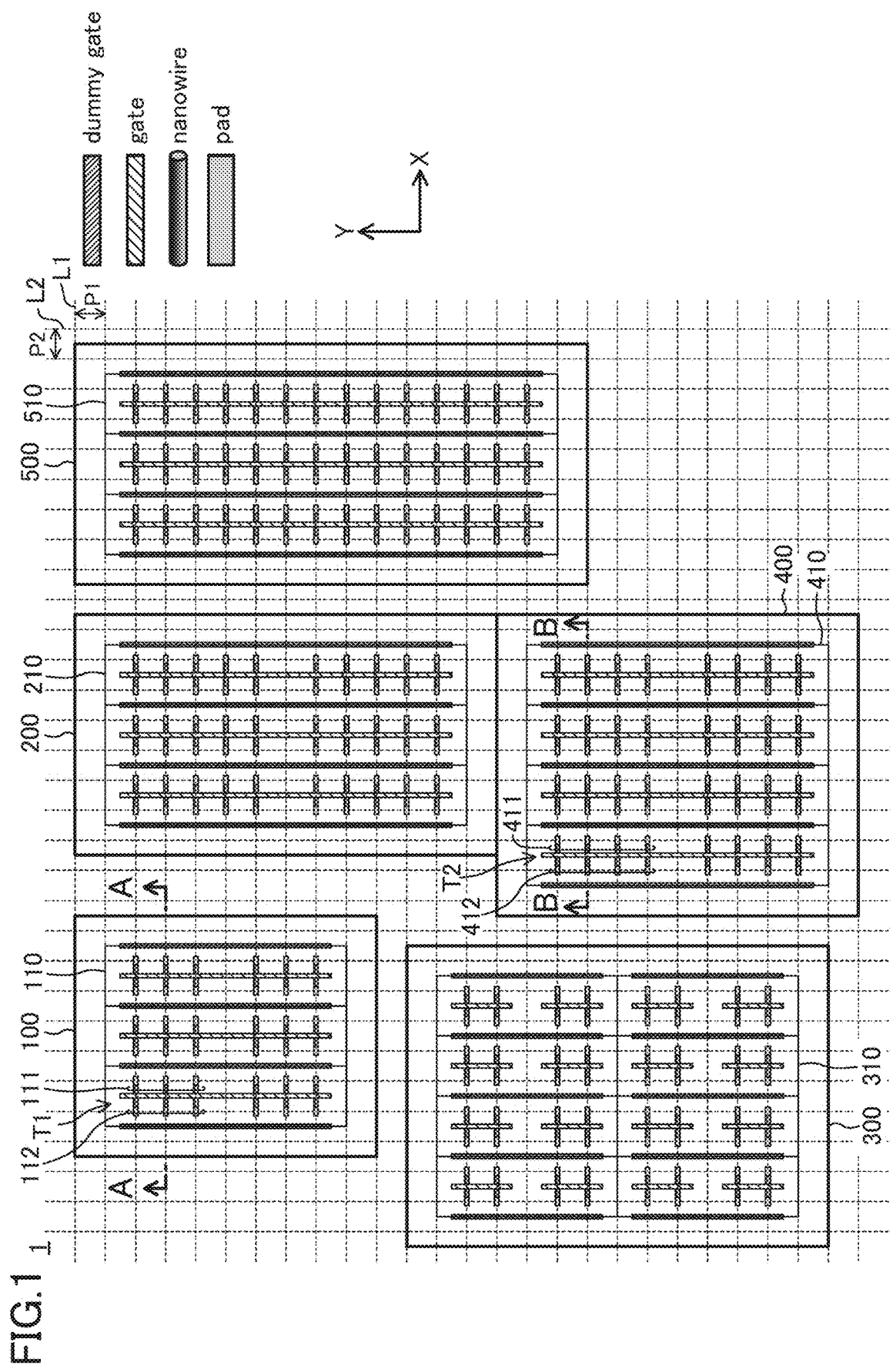
FIG. 1 is a schematic plan view of a layout configuration example of a semiconductor chip according to an embodiment.

FIG. 1 is a schematic plan view of a layout configuration example of a semiconductor chip according to an embodiment. In FIG. 1, the lateral direction on the paper is an X direction (corresponding to a first direction), and the longitudinal direction on the paper is a Y direction (corresponding to a second direction). FIG. 1 illustrates grid lines L1 extending in the X direction and arranged in parallel at a pitch P1 (corresponding to a first pitch) and grid lines L2 extending in the Y direction and arranged in parallel at a pitch P2 (corresponding to a second pitch). However, in an actual semiconductor chip, the grid lines L1 and L2 are invisible. In FIG. 1, nanowires 111, 411 of nanowire FETs T1 and T2 extend in the X direction, and are aligned with the associated grid lines L1. Nanowires of other nanowire FETs also similarly extend in the X direction, and are aligned with the associated grid lines L1. Pads 112, 412 of the nanowire FETs T1 and T2 are spaced apart from one another in the Y direction, and are arranged on the associated grid lines L2. Pads of the other nanowire FETs are also similarly spaced apart from one another in the Y direction, and are arranged on the associated grid lines L2. FIG. 1 does not illustrate local interconnects, vias, metal interconnects, and other components.

A semiconductor chip 1 of FIG. 1 includes a low-height standard cell block 100, a high-height standard cell block 200, a memory block 300, an analog block 400, and an IO block 500. The low-height standard cell block 100 includes low-height standard cells 110 having a relatively low cell height (a size in the Y direction). The high-height standard cell block 200 includes high-height standard cells 210 having a relatively high cell height. In FIG. 1, nanowire FETs of the low-profile standard cells 110 each include nanowires arranged in three rows in the Y direction, and three pads spaced apart from one another in the Y direction and connected to the respective rows of nanowires. Nanowire FETs of the high-height standard cells 210 each include nanowires arranged in five rows in the Y direction, and five pads spaced apart from one another in the Y direction and connected to the respective rows of nanowires. The cell height of the low-height standard cells 110 is eight times the pitch P1, i.e., (P1×8), and the cell height of the high-height standard cells 210 is 12 times the pitch P1, i.e., (P1×12).

The memory block 300 includes memory cells 310, and achieves memory functions such as a static random access memory (SRAM) and a dynamic random access memory (DRAM). The memory cells 310 constitute a memory cell array. The memory block 300 includes peripheral circuits such as a sense amplifier and a decoder in addition to the memory cells 310. The analog block 400 includes analog cells 410, and achieves analog functions such as a digitalto-analog converter (DAC), an analog-to-digital converter (ADC), and a phase-locked loop (PLL). The analog block 400 may include an analog circuit and a digital circuit. The IO block 500 includes IO unit cells 510, and receives and delivers signals from and to the outside of the semiconductor chip 1. The IO block 500 includes circuits such as a level shifter, an electro-static discharge (ESD) circuit, and an input-output buffer.

In FIG. 1, nanowire FETs of the memory cells 310 each include nanowires arranged in two rows in the Y direction, and two pads spaced apart from each other in the Y direction and connected to the respective rows of nanowires. Nanowires FETs of the analog cells 410 each include nanowires arranged in four rows in the Y direction, and four pads spaced apart from one another in the Y direction and connected to the respective rows of nanowires. Nanowires FETs of the IO unit cells 510 each include nanowires arranged in 14 rows in the Y direction, and 14 pads spaced apart from one another in the Y direction and connected to the respective rows of nanowires. The cell height of the memory cell 310 is six times the pitch P1, i.e., (P1×6), the cell height of the analog cell 410 is ten times the pitch P1, i.e., (P1×10), and the cell height of the IO unit cell 510 is 15 times the pitch P1, i.e., (P1×15).

Figure 2:
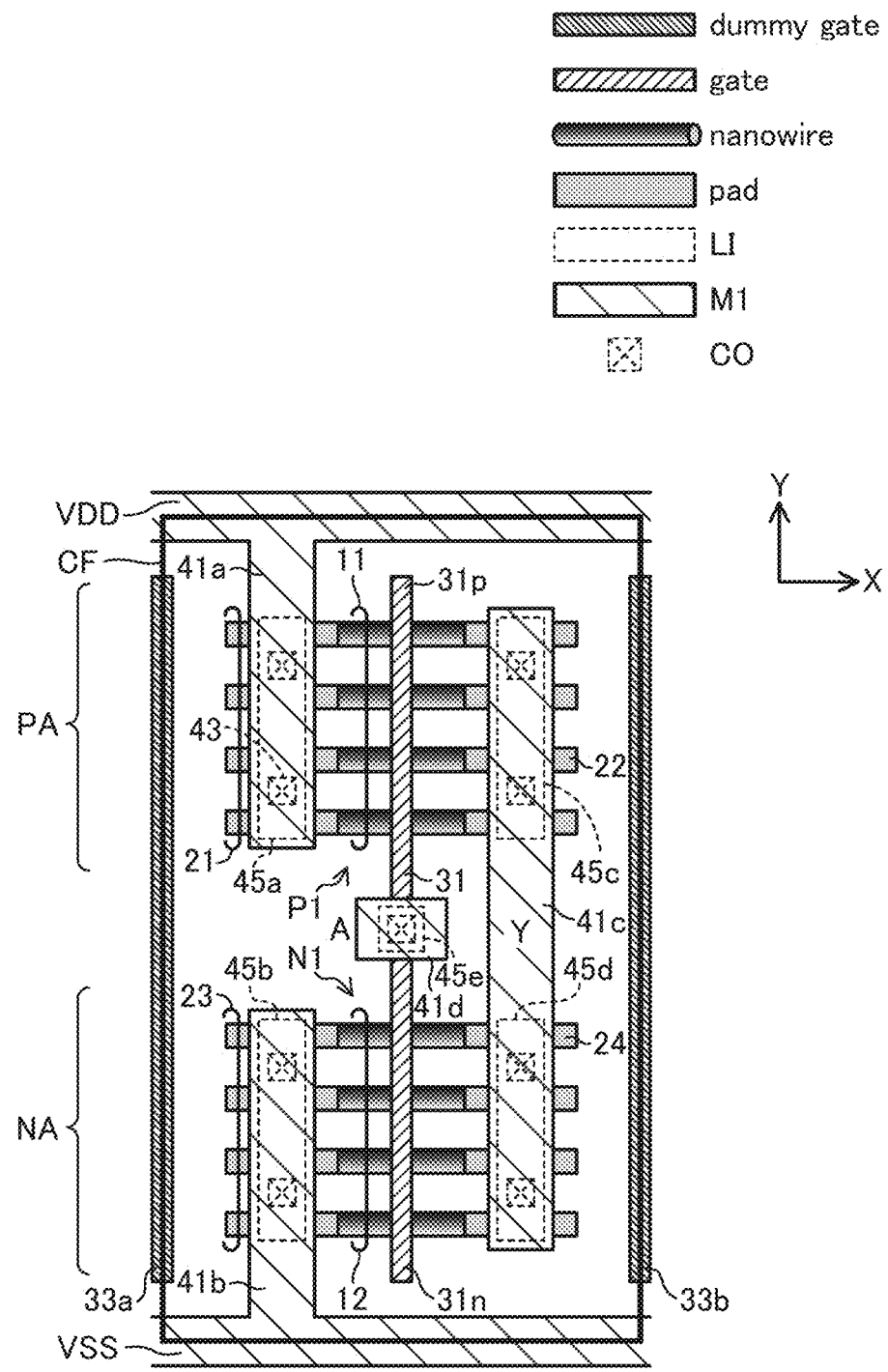
FIG. 2 is a plan view of a layout configuration example of a standard cell having nanowire PETs.

FIG. 2 is a plan view of a layout configuration example of a standard cell having nanowire PhTs. FIG. 2 also illustrates local interconnects and metal interconnects. The standard cell shown in FIG. 2 and including the nanowire PhTs constitutes an inverter having an input A and an output Y. A p-type nanowire FET P1 is provided in a p-type transistor area PA, and an n-type nanowire FET N1 is provided in an n-type transistor area NA. The nanowire PET P1 includes a group of a plurality of parallelly arranged nanowires 11 extending in the X direction, and the nanowire FET N1 includes a group of a plurality of parallelly arranged nanowires 12 extending in the X direction. Here, the groups of nanowires 11, 12 each include nanowires arranged in four rows in the Y direction, and each include eight nanowires in total if they are assumed to include nanowires arranged in two rows in the vertical direction, i.e., the direction perpendicular to the substrate. Each of the nanowires 11, 12 has a cylindrical shape, extends horizontally above the substrate, i.e., extends parallel to the substrate, and is comprised of, e.g., silicon. Pairs of pads 21 and 22 each connected to an associated one of the nanowires 11 and pairs of pads 23 and 24 each connected to an associated one of the nanowires 12 are provided. P-type impurities are introduced into at least portions of the pads 21, 22 connected to the nanowires 11 and serving as source/drain regions of the nanowire FET P1. N-type impurities are introduced into at least portions of the pads 23, 24 connected to the nanowires 12 and serving as source/drain regions of the nanowire PET N1.

Here, the groups of the pads 21, 22, 23, 24 each include four pads separately arranged in the Y direction. The pads 21, 22 are each connected to an associated one of the four nanowires 11 arranged in the Y direction. The pads 23, 24 are each connected to an associated one of the four nanowires 12 arranged in the Y direction.

The standard cell of FIG. 2 is provided with a gate line 31 extending linearly in the Y direction. The gate line 31 is comprised of a gate electrode 31p of the nanowire PET P1 and a gate electrode 31n of the nanowire FET N1 which are integrally formed with each other, and surrounds peripheries of the nanowires 11, 12 within predetermined ranges of the nanowires 11, 12 in the X direction. Lateral sides of a cell frame CF of the standard cell of FIG. 2 are respectively provided with dummy gate lines 33a and 33b extending in the Y direction.

A metal interconnect layer M1 is formed above the nanowire FETs P1 and N1. The metal interconnect layer M1 includes an interconnect VDD disposed on the upper side of the cell frame CF and supplying a power supply potential, and an interconnect VSS disposed on the lower side of the cell frame CF and supplying a ground potential. The metal interconnect layer M1 further includes interconnects 41a to 41d. The interconnect 41a is formed so as to extend downward from the interconnect VDD along the Y direction, and is connected to the pads 21 through a local interconnect 45a. The interconnect 41b is formed so as to extend upward from the interconnect VSS along the Y direction, and is connected to the pads 23 through a local interconnect 45b. The interconnect 41c connects the pads 22, 24 together, is connected to the pads 22 through a local interconnect 45c, and is connected to the pads 24 through a local interconnect 45d. The interconnect 41d is connected to the gate line 31 through a local interconnect 45e. The interconnects 41c and 41d correspond to the output Y and the input A of the inverter constituted by this standard cell, respectively.

The metallic interconnects 41a to 41d are each connected to an associated one or ones of the pads 21, 22, 23, 24 and the gate line 31 through associated ones of the local interconnects 45b, 45c, 45d, and 45e and contacts 43. Alternatively, the metallic interconnects may be connected to the pads and the gate line only through the local interconnects, not through the contacts, or may be connected to the pads and the gate line only through the contacts, not through the local interconnects.

Figure 3:
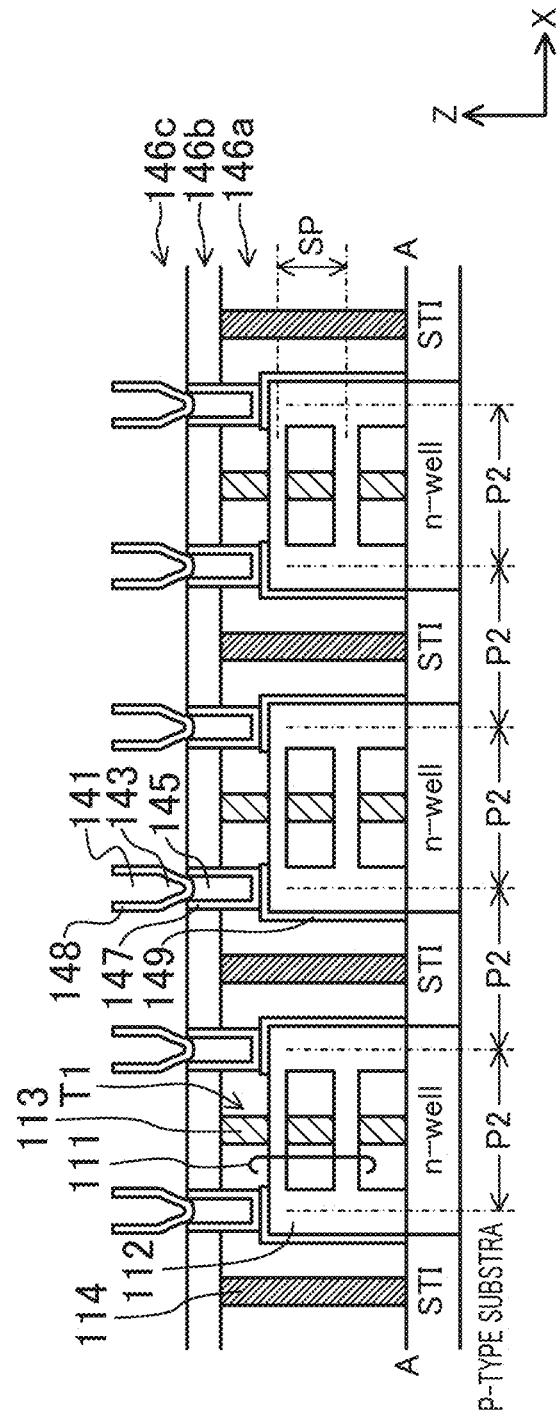
FIG. 3 is a schematic cross-sectional view of the layout configuration of FIG. 1.

FIG. 3 is a schematic cross-sectional view taken along line A-A of the semiconductor chip of FIG. 1, and illustrates a cross-sectional configuration of the low-height standard cell block 100 taken along the X direction. In FIG. 3, the reference numeral 111 indicates nanowires, 112 indicates a pad, 113 indicates a gate line, and 114 indicates a dummy gate line. In the configuration of FIG. 3, the nanowires 111 are stacked in two tiers at the nanowire stack pitch SP in a Z direction (the direction perpendicular to the substrate surface (an XY plane)). Consequently, in a transistor T1, a group of the nanowires 111 extending in the X direction includes nanowires arranged in three rows in the Y direction, nanowires arranged in two rows in the Z direction, and thus includes six (=3×2) nanowires 111 in total.

Figure 4:
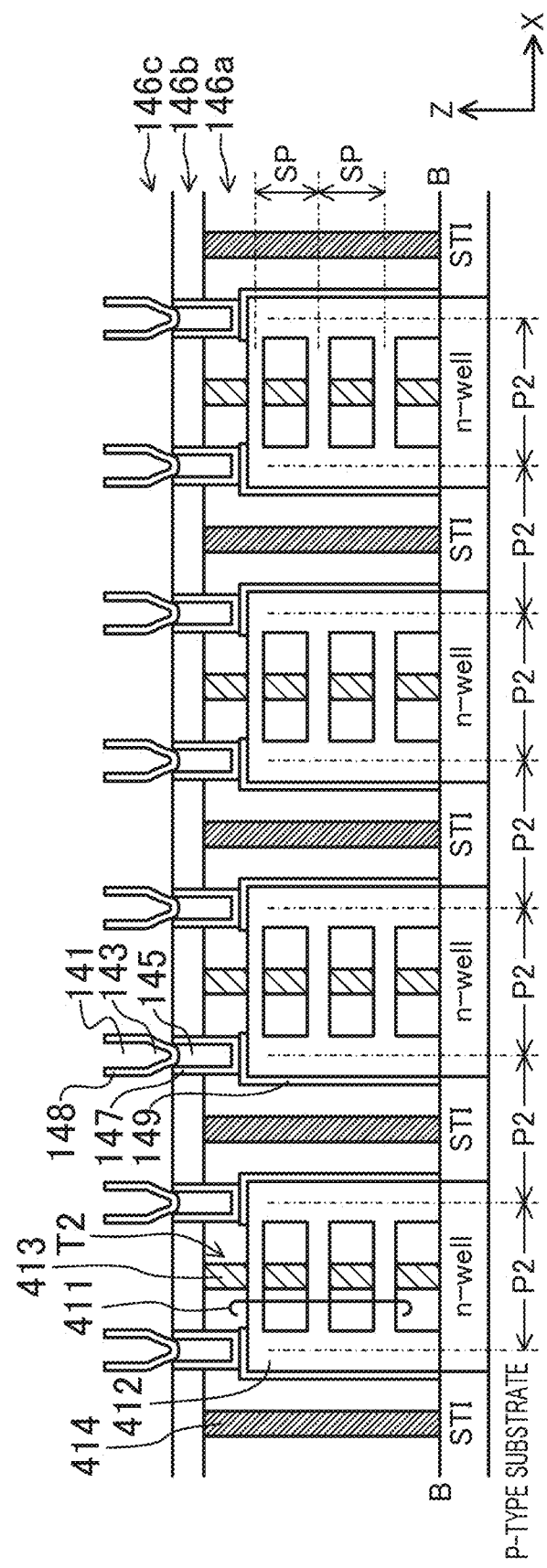
FIG. 4 is a schematic cross-sectional view of the layout configuration of FIG. 1.

FIG. 4 is a schematically cross-sectional view taken along line B-B of the semiconductor chip 1 of FIG. 1, and illustrates a cross-sectional configuration of the analog block 400 taken along the X direction. In FIG. 4, the reference numeral 411 indicates nanowires, 412 indicates a pad, 413 indicates a gate line, and 414 indicates a dummy gate line. In the configuration of FIG. 4, the nanowires 411 are staked in three tiers at the nanowire stack pitch SP in the Z direction. Consequently, in a transistor T2, a group of the nanowires 411 extending in the X direction includes nanowires arranged in four rows in the Y direction, nanowires arranged in three rows in the Z direction, and thus includes 12 (=4×3) nanowires 411 in total.

As illustrated in FIGS. 3 and 4, interconnects 141 of the metal interconnect layer M1 are connected to the pads 112, 412 through contacts 143 and local interconnects 145. The contacts 143 are formed together with the interconnects 141 of the metal interconnect layer M1 using a dual-damascene process. The contacts 143 may be formed separately from the interconnects 141 of the metal interconnect layer M1. The interconnects 141 of the metal interconnect layer M1 are made of, e.g., Cu, and have a surface on which a barrier metal 148 including, e.g., tantalum or tantalum nitride is formed. The local interconnects 145 are made of, e.g., tungsten, and have a surface on which a glue film 147 including, e.g., titanium or titanium nitride is formed. The local interconnects 145 may be made of cobalt. In this case, the glue film 147 may be omitted. The pads 112, 412 have a surface on which a silicide film 149 made of, e.g., nickel or cobalt is formed.

Interlayer insulating films 146a and 146b are each, e.g., a silicon oxide film. An interlayer insulating film 146c is a low dielectric constant film such as SiOC or a porous film. The interlayer insulating film 146c may have a multilayer structure including two or more layers.

The gate lines 113 and 413 are made of, e.g., polysilicon. The gate lines 113 and 413 may be made of a material including a metal such as titanium nitride. A gate insulating film is, e.g., a silicon oxide film, and is formed by, e.g., thermal oxidation. The gate insulating film may be formed of an oxide of hafnium, zirconium, lanthanum, yttrium, aluminum, titanium, or tantalum.

As can be seen from the cross-sectional views of FIGS. 3 and 4, the lower surfaces of the pads 112, 412 are below those of the nanowires 111, 411. The upper surfaces of the nanowires 111, 411 are at the same height as those of the pads 112, 412. The upper surfaces of the nanowires 111, 411 may be below those of the pads 112, 412.

Although not shown, the other blocks, i.e., the high-height standard cell block 200, the memory block 300, and the IO block 500 also have a cross-sectional configuration similar to that of FIG. 3 or 4.

Figure 5:
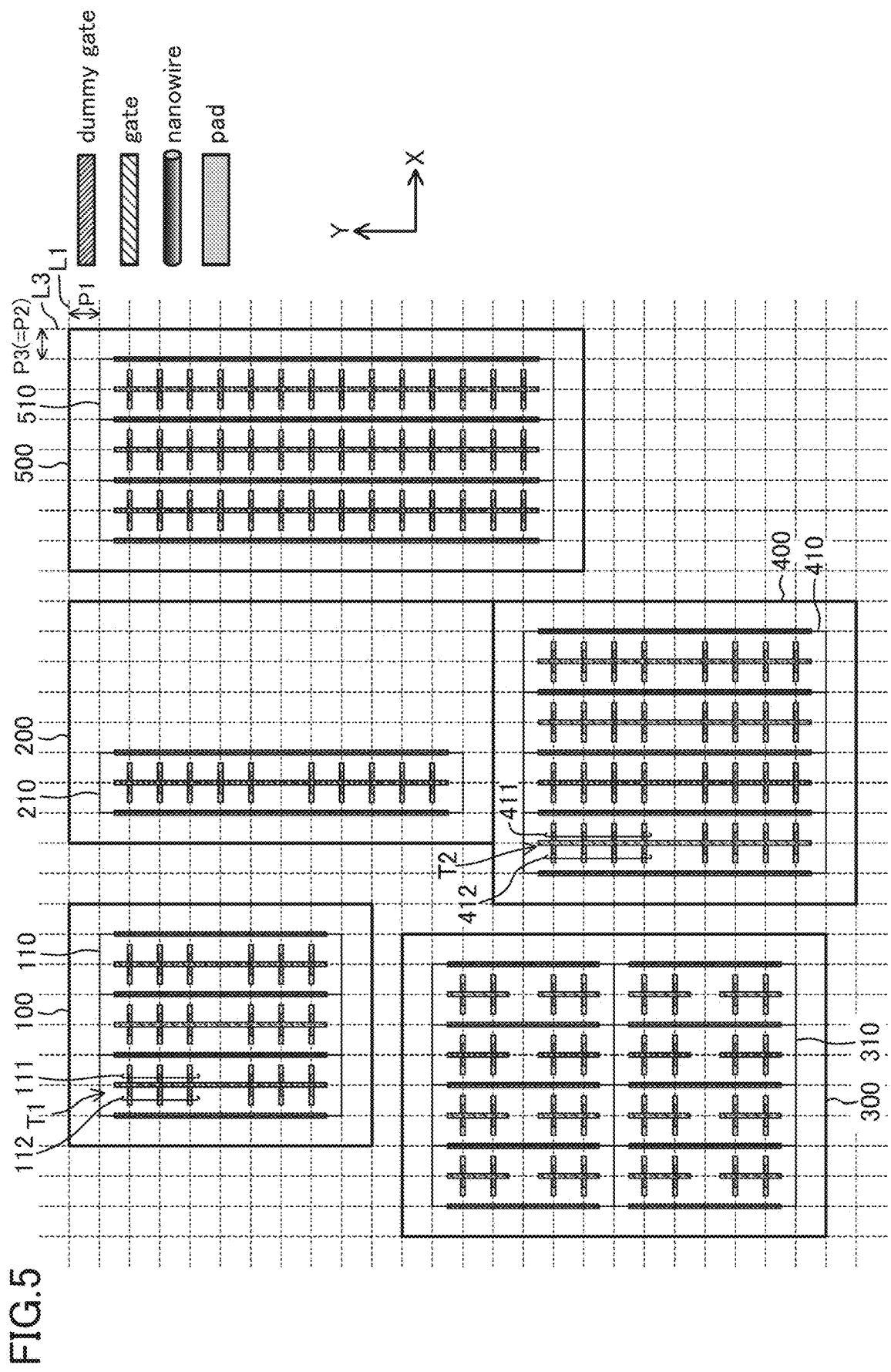
FIG. 5 illustrates a process of cell arrangement achieving the layout configuration of FIG. 1.

FIG. 5 illustrates a process of cell arrangement achieving the layout configuration of the semiconductor chip 1 of FIG. 1. FIG. 5 illustrates a state where the high-height standard cells 210 of the high-height standard cell block 200 are being arranged. FIG. 5 illustrates the grid lines L1 extending in the X direction and arranged at the pitch P1 and grid lines L3 extending in the Y direction and arranged in parallel at a pitch P3, where P3=P2. The grid lines L1 are the same as the grid lines L1 shown in FIG. 1, and the grid lines L3 deviate from the grid lines L2 shown in FIG. 1 by a half pitch. In layout design, the grid lines L1 and L3 are displayed on, e.g., a screen of a layout design apparatus.

Here, for example, the low-height standard cell 110 has a cell width (a size in the X direction) that is double the pitch P3, and has a size in the Y direction, i.e., a cell height, that is eight times the pitch P1. The high-height standard cell 210, the memory cell 310, the analog cell 410, and the IO unit cell 510 also have a cell width of an integer multiple of the pitch P3 and have a cell height of an integer multiple of the pitch P1. The low-height standard cell 110 is designed in advance such that, when its contour is aligned with the grid lines L1 and L3, the nanowires extending in the X direction are positioned on the grid lines L1, and the gates extending in the Y direction are positioned on the grid lines L3. The pads are arranged at positions deviated by a half pitch (=P3/2) from the gates in the X direction. The high-height standard cell 210, the memory cell 310, the analog cell 410, and the IO unit cell 510 are also designed similarly. Consequently, a designer who performs layout design aligns the contour of each cell with associated ones of the grid lines L1 and L3 and can thereby easily design the layout configuration as in FIG. 1.

Here, the semiconductor chip 1 of FIG. 1 includes, e.g., the low-height standard cell block 100 including the low-height standard cells 110 having the nanowire FETs as a first block and the analog block 400 including the nanowire FETs as a second block. In the low-height standard cell block 100 and the analog block 400, the nanowires have an arrangement pitch in the Y direction of an integer multiple of the pitch P1, and the pads have an arrangement pitch in the X direction of an integer multiple of the pitch P2. This configuration improves the regularity of arrangement of the nanowires and the pads of the semiconductor chip 1. Consequently, the semiconductor chip 1 is easily manufactured, and a reduction in process-induced variations and improvement in yield can be achieved.

As shown in FIGS. 3 and 4, in the low-height standard cell block 100 and the analog block 400, the nanowires have an arrangement pitch in the Z direction of an integer multiple of the nanowire stack pitch SP. This configuration improves the regularity of arrangement of the nanowires of the semiconductor chip 1. Consequently, the semiconductor chip 1 is easily manufactured, and a reduction in process-induced variations and improvement in yield can be achieved.

In the low-profile standard cell block 100 and the analog block 400, the gate lines constituting the gate electrodes and the dummy gate lines have an arrangement pitch in the X direction of an integer multiple of the pitch P3. This configuration improves the regularity of arrangement of the gate lines and dummy gate lines of the semiconductor chip 1. Consequently, the semiconductor chip 1 is easily manufactured, and a reduction in process-induced variations and improvement in yield can be achieved.

Also in the entire semiconductor chip 1 including the high-height standard cell block 200, the memory block 300, and the IO block 500, the nanowires have an arrangement pitch in the Y direction of an integer multiple of the pitch P1 and an arrangement pitch in the Z direction of an integer multiple of the nanowire stack pitch SP. The pads have an arrangement pitch in the X direction of an integer multiple of the pitch P2, and the gate lines and the dummy gate lines have an arrangement pitch in the X direction of an integer multiple of the pitch P3 (=P2). Consequently, the semiconductor chip 1 is easily manufactured, and a reduction in process-induced variations and improvement in yield can be achieved.

The configuration of the nanowire FETs shown in FIG. 1 and other figures is by way of example, and for example, the number of the nanowires in the Y direction and the number of tiers thereof in the Z direction, the size of the pads, and other features are not limited to those shown here. The number of the nanowires in each block may be determined based on the driving capability of the nanowire FETs required in the block.

The cell heights of the standard cells 110 and 210 shown in FIG. 1 are non-limiting examples. Although in FIG. 1 the standard cells have two different heights, the heights are non-limiting examples. For example, a single standard cell block including standard cells having the same cell height may be disposed on the semiconductor chip.

In the foregoing description, the nanowire is cylindrical. However, this shape is a non-limiting example. For example, the cross-sectional shape of the nanowire may be oval or elliptical, or the nanowire may be in the shape of a prism such as a rectangular prism.

Figure 6:
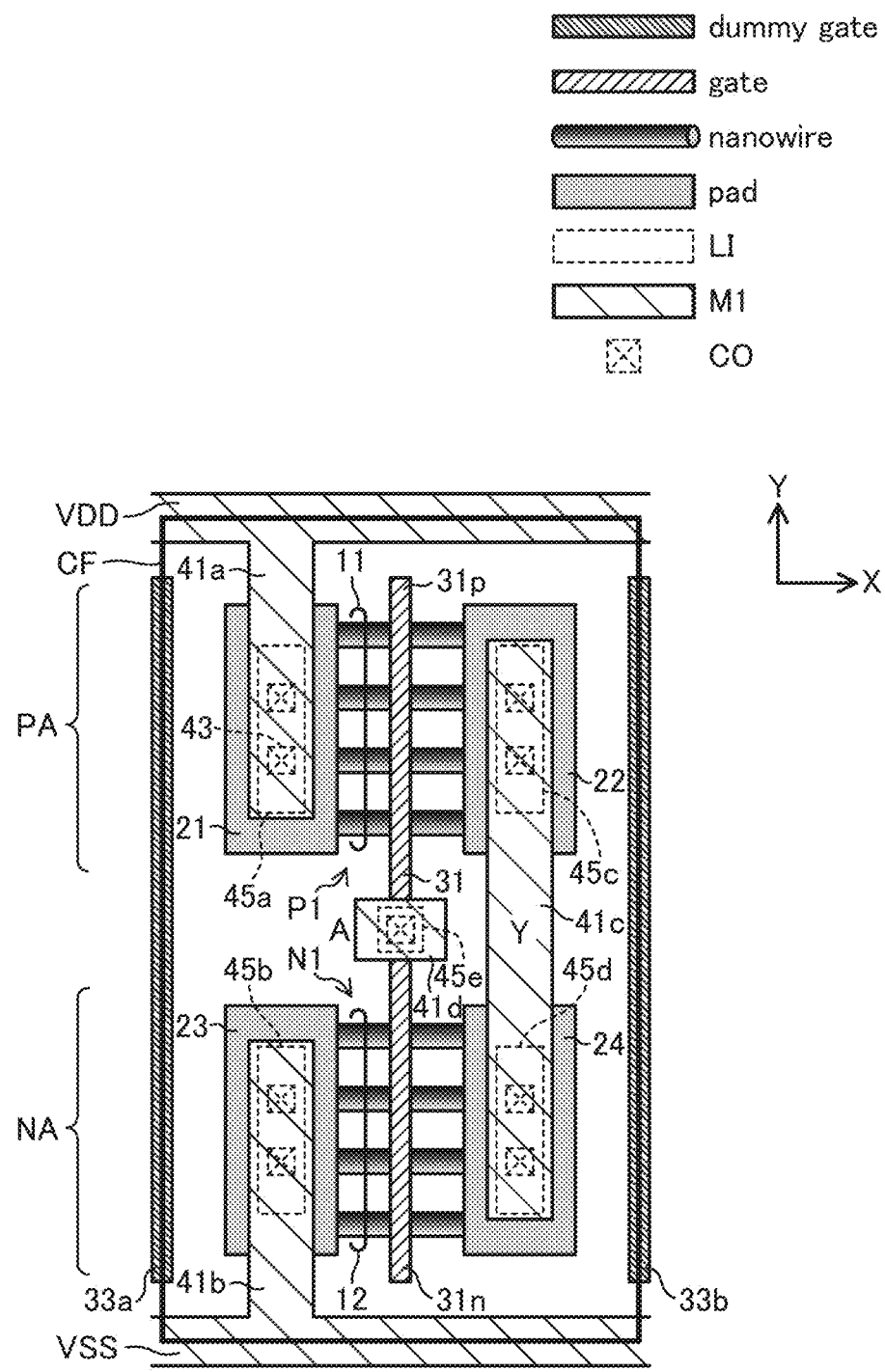
FIG. 6 shows a variation of the configuration of the standard cell of FIG. 2.

In the foregoing description, in the nanowire FET, the pads are separate from the nanowires arranged in the Y direction. However, the pads may be integrated with the nanowires arranged in the Y direction. FIG. 6 shows a variation of the layout configuration example of FIG. 2. In FIG. 6, pads 21, 22, 23, 24 are each integrated with associated ones of the groups of nanowires 11, 12 each including four nanowires arranged in the Y direction.

In the foregoing description, the pitch between the gate lines is equal to the pitch between the pads. However, this is a non-limiting example. The gate line extends linearly along the Y direction in the p-type transistor region and the n-type transistor region. However, this is a non-limiting example.

The present disclosure provides a layout configuration of a semiconductor integrated circuit device including a nanowire PET, the layout configuration being effective for making manufacturing the device easy, and is useful for improving performance of the semiconductor integrated circuit device.

What is claimed is:

1. A semiconductor chip, comprising:
a first block including a first standard cell having a first nanowire field effect transistor (FET); and
a second block including a second standard cell having a second nanowire FET, wherein
the first nanowire FET includes:
   at least two first nanowires extending in a first direction;
   a first pair of pads that are respectively arranged at both ends of the first nanowires in the first direction, and each connected to the first nanowires; and
   a first gate electrode that extends in a second direction perpendicular to the first direction, and surrounds a periphery of the first nanowires,
   the first pair of pads are arranged at a first pitch in the first direction, and
   the first nanowires are arranged at a second pitch in a third direction perpendicular to the first direction and the second direction;
the second nanowire FET includes:
   at least two second nanowires extending in the first direction;
   a second pair of pads that are respectively arranged at both ends of the second nanowires in the first direction, and each connected to the second nanowires; and
   a second gate electrode that extends in the second direction, and surrounds a periphery of the second nanowires,
   the second pair of pads are arranged at the first pitch in the first direction, and
   the second nanowires are arranged at the second pitch in the third direction; and
the first standard cell and the second standard cell have different sizes in the second direction from each other.

2. The semiconductor chip of claim 1, wherein in the first block, a first gate line constituting the first gate electrode and a first dummy gate line are arranged at the first pitch in the first direction.

3. The semiconductor chip of claim 2, wherein in the second block, a second gate line constituting the second gate electrode and a second dummy gate line are arranged at the first pitch in the first direction.

4. The semiconductor chip of claim 1, wherein the first standard cell has a size in the first direction of an integer multiple of the first pitch.

5. The semiconductor chip of claim 4, wherein the second standard cell has a size in the first direction of an integer multiple of the first pitch.

6. The semiconductor chip of claim 1, wherein the first standard cell further has a third nanowire FET; the third nanowire FET includes:
   at least two third nanowires extending in the first direction;
   a third pair of pads that are arranged at both ends of the third nanowires in the first direction, and connected to the third nanowires; and
   a third gate electrode that extends in the second direction, and surrounds a periphery of the third nanowires,
   the third pair of pads are arranged at the first pitch in the first direction, and
   the third nanowires are arranged at the second pitch in the third direction.

7. The semiconductor chip of claim 6, wherein the first nanowire FET is a p-type nanowire FET and the third nanowire FET is an n-type nanowire FET.

8. A semiconductor chip, comprising:
a first block including a first standard cell having a first nanowire field effect transistor (FET); and
a second block including a second standard cell having a second nanowire FET, wherein
the first nanowire FET includes:
   at least two first nanowires extending in a first direction;
   a first pair of pads that are respectively arranged at both ends of the first nanowires in the first direction, and each connected to the first nanowires; and
   a first gate electrode that extends in a second direction perpendicular to the first direction, and surrounds a periphery of the first nanowires,
   the first nanowires are arranged at a first pitch in a third direction perpendicular to the first direction and the second direction;
in the first block, a first gate line constituting the first gate electrode and a first dummy gate line are arranged at a second pitch in the first direction;
the second nanowire FET includes:
   at least two second nanowires extending in the first direction;
   a second pair of pads that are respectively arranged at both ends of the second nanowires in the first direction, and each connected to the second nanowires; and
   a second gate electrode that extends in the second direction, and surrounds a periphery of the second nanowires,
   the second nanowires are arranged at the first pitch in the third direction;
in the second block, a second gate line constituting the second gate electrode and a second dummy gate line are arranged at the second pitch in the first direction; and
the first standard cell and the second standard cell have different sizes in the second direction from each other.

9. The semiconductor chip of claim 8, wherein the first standard cell has a size in the first direction of an integer multiple of the second pitch.

10. The semiconductor chip of claim 9, wherein the second standard cell has a size in the first direction of an integer multiple of the second pitch.

11. The semiconductor chip of claim 8, wherein the first standard cell further has a third nanowire FET; the third nanowire FET includes:
   at least two third nanowires extending in the first direction;
   a third pair of pads that are respectively arranged at both ends of the third nanowires in the first direction, and each connected to the third nanowires; and a third gate electrode that extends in the second direction, and surrounds a periphery of the third nanowires, the third nanowires are arranged at the first pitch in the third direction, and in the first block, a third gate line constituting the third gate electrode and a third dummy gate line are arranged at the second pitch in the first direction.

12. The semiconductor chip of claim 11, wherein the first nanowire FET is a p-type nanowire FET and the third nanowire FET is an n-type nanowire FET.

* * * * *